United States Patent
Durst et al.

(10) Patent No.: US 6,240,934 B1
(45) Date of Patent: Jun. 5, 2001

(54) METHOD AND DEVICE FOR TREATING HOLES OR RECESSES EXTENDING INTO WORKPIECES WITH LIQUID TREATMENT MEDIA

(75) Inventors: Franz Durst, Langensendelbach; Gunter Brenn, Erlangen; Michael Schafer, Numberg; Heinrich Meyer; Heribert Streup, both of Berlin, all of (DE)

(73) Assignee: Atotech Deutschland GmbH (DE)

( * ) Notice: Subject to any disclaimer, the term of this patent is extended or adjusted under 35 U.S.C. 154(b) by 0 days.

(21) Appl. No.: 09/036,107

(22) PCT Filed: Sep. 6, 1996

(86) PCT No.: PCT/DE96/01716
§ 371 Date: Aug. 16, 2000
§ 102(e) Date: Aug. 16, 2000

(87) PCT Pub. No.: WO97/11209
PCT Pub. Date: Mar. 27, 1997

(30) Foreign Application Priority Data

Sep. 6, 1995 (DE) .............................................. 195 34 521

(51) Int. Cl.⁷ ........................................................ B08B 3/02
(52) U.S. Cl. .............................. 134/2; 134/22.18; 134/23; 134/32; 134/152; 134/166 R; 134/167 R
(58) Field of Search .......................... 134/2, 22.1, 22.11, 134/22.12, 22.13, 22.14, 22.16, 22.17, 22.18, 23, 25.5, 32, 104.2, 104.3, 109, 110, 111, 902, 166 R, 167 R, 168 R, 169 R, 152, 198, 199, 144, 171

(56) References Cited

U.S. PATENT DOCUMENTS 4,119,439 * 10/1978 Boucher ................................ 134/183
4,559,664 * 12/1985 Bohme et al. .................... 134/171 X
4,789,405 * 12/1988 Blasing et al. ............................ 134/1
5,190,065 * 3/1993 Kovac et al. ......................... 134/107
5,246,023 * 9/1993 Breunsbach et al. .............. 134/57 R
5,366,562 * 11/1994 Schwarze et al. ........... 134/169 R X
5,778,911 * 7/1998 Yoshio ............................... 134/104.2
5,891,257 * 4/1999 Stephanie et al. ........................ 134/5

FOREIGN PATENT DOCUMENTS

| 3305564 | * 3/1984 | (DE) . |
| 35 28 575 | 2/1987 | (DE) . |
| 36 24 481 | 1/1988 | (DE) . |
| 36 38 630 | 5/1988 | (DE) . |
| 3708529 | * 9/1988 | (DE) . |
| 39 05 100 | 8/1990 | (DE) . |

* cited by examiner

Primary Examiner—Philip R. Coe
(74) Attorney, Agent, or Firm—Paul & Paul

(57) ABSTRACT

The treatment, for example the cleaning of holes or recesses in workpieces, is problematic when the holes or recesses have an opening width of below 0.5 mm, and especially when the latter do not penetrate the workpiece (blind bores). In known methods, gas bubbles adhering to the side-walls of holes of this type cannot be removed or liquids situated within the holes cannot be effectively exchanged.

Figure 1:
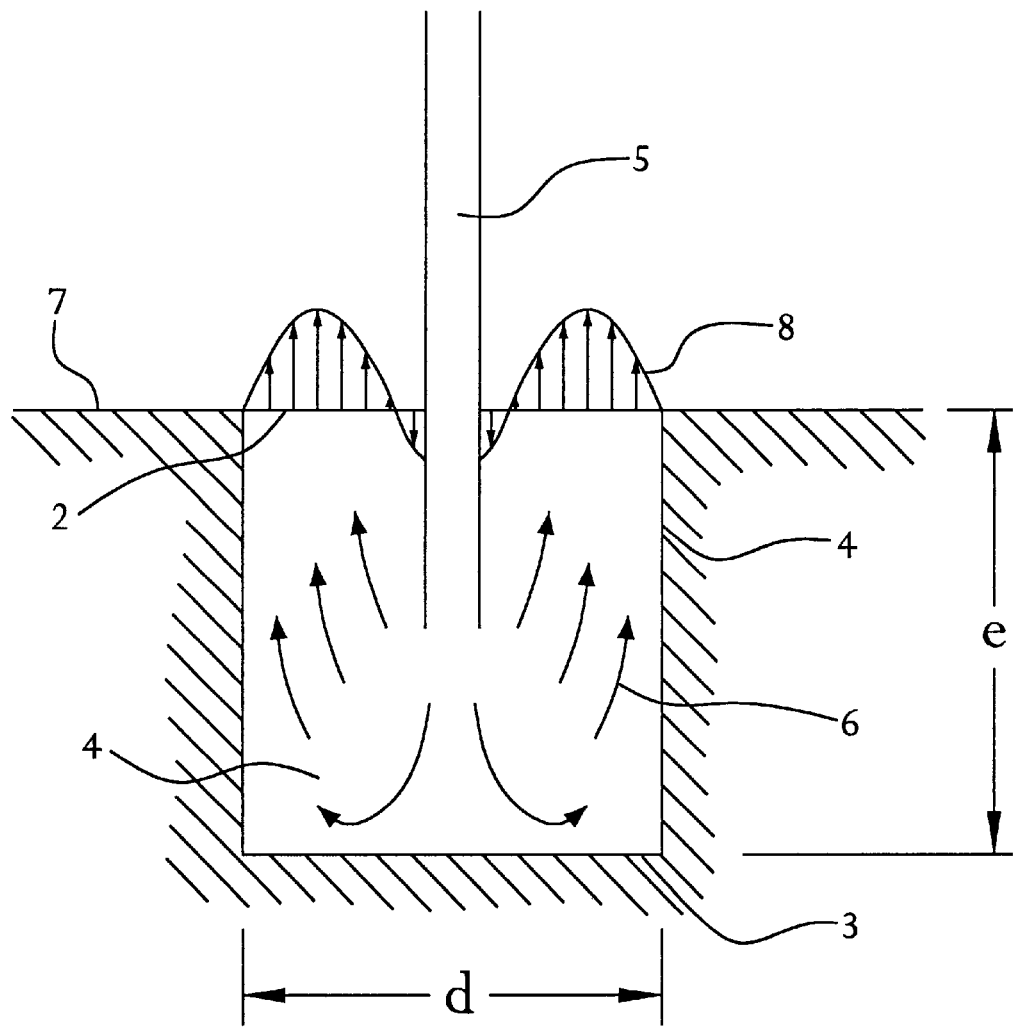

With the method according to the invention an effective exchange of the liquid contained in the holes and situated outwith the holes is made possible. For this purpose the liquid treatment means is sprayed as a jet into the holes, said jet having a diameter which is smaller than that of the holes.

Furthermore, a device is described for carrying out this method which is characterised by a nozzle with one or several nozzle discharge openings with a diameter below 0.5 mm, by a liquid supply unit by means of which liquid treatment medium is pumped through the nozzle discharge openings and by a filter unit, communicating with the openings and the feeder unit, for removing particles from the treatment medium.

16 Claims, 8 Drawing Sheets

METHOD AND DEVICE FOR TREATING HOLES OR RECESSES EXTENDING INTO WORKPIECES WITH LIQUID TREATMENT MEDIA

SPECIFICATION

The invention relates to a method and to a device for treating very small holes or recesses extending into workpieces with liquid treatment media.

Should workpiece surfaces be treated with liquids, the surfaces are as a rule brought into contact with the treatment media by immersion. Typical examples of usage are represented by the cleaning of substrates, for example of covering pieces, the electroplating treatment of metal parts and plastic material parts and also the electro-plating procedures in the production of circuit boards.

In many areas of technology thin metal layers are applied to the surfaces of materials, in order to impart to the surfaces certain properties, which are required for the use of materials in cases of industrial application. Although there is already a multitude of varying coating techniques available, electroplating metal plating methods still represent important treatment methods despite the frequent occurence of problems specific to the procedure.

For example, problems can arise, when workpieces with very small holes or with other recesses, which extend into the surface of the workpieces and have small dimensions, are to be treated with liquid medium. In this case these holes and recesses are not adequately or not at all washed through, with the result that the desired treatment cannot be achieved.

In circuit board technology for example the sides of the holes, which extend through the circuit board laminate or which are inserted as blind bores, are provided with a metal layer. For this purpose, after being produced, for example by drilling, these holes or recesses have firstly to be cleared of impurities generally, for example of resin smears caused by boring on the drilled hole wall while the circuit board is brought into contact with etching agents. Furthermore, chemical solutions with surface-active substances (wetting agents) are inserted also for cleaning the holes. After cleaning, the electrically insulating drilled hole walls are activated with solutions containing a noble metal and subsequently are copper-plated or nickel-plated, as a rule with electroless metallization solutions. Then a metal layer with a thickness of roughly 20 $\mu$m is deposited by means of electrolytic plating on the wall surfaces of the holes.

Because of the miniaturisation of circuit structures on circuit boards, smaller and smaller holes are being formed, for example with a diameter of 0.2 mm, in circuit boards, which still need to be reliably plated. For this reason there exist various methods for removing air from these holes and ensuring an adequate exchange of liquid between the inside of the hole and the liquid treatment medium outwith the holes. Special methods are employed for flushing out these very small holes.

In the German Patent document DE 35 28 575 A1 there is known, for this purpose, a method for cleaning, activating and/or plating boreholes in horizontally placed circuit boards, in which the circuit boards run over a drenching line at a constant speed, said line being formed by a jet arranged beneath the travelling line and perpendicular to the direction of movement, and in which the liquid treatment medium is conveyed in the form of a vertical wave to the underside of the circuit board and also a device for carrying out this method is known.

Further papers have been published on this method describing special applications for flushing out drilled holes in circuit boards (for example in DE 36 38 630 A1, DE 36 24 481 A1).

Another solution can be drawn from the German Patent document DE 39 05 100 C2, in which a method is given for the chemical and electrolytic surface treatment of board-shaped workpieces, which are furnished with small openings, in aqueous solutions, the workpiece having two autonomous vibration movements which are independent of one another. The first of the two vibration movements extends perpendicular to the surface of the workpiece and the second in roughly the same direction as the first and at the same time as the latter, the frequency of the first movement being essentially lower than the frequency of the second, representing a heavily pulsating oscillation in quick sucession. The amplitude of the first vibrating movement is essentially greater than the amplitude of the second.

Numerical simulations for determining the flow conditions in drilled holes of circuit boards have shown in addition that oscillations of that type, orientated perpendicular to the surface of the circuit boards, assist the liquid exchange more effectively than oscillations which have vibration components exclusively parallel to the circuit board surface.

However the mentioned solutions to the problem of reliably treating very small holes and especially blind bores are not suitable, since, in these cases, the flow only works in the entry region of the holes. Blind bores and other recesses extend only to a definite depth in a workpiece or solid body. Apart from problems arising also from very small clearance holes, the problem exists here as well in that the liquid flowing in must also flow out again to attain an adequate liquid exchange. Otherwise, at best a very slow material exchange would be possible by means of diffusion.

Because of the boundary layer adhering to the hole wall or because of a finite viscosity from applicable treatment liquids, a through-flow by means of vibration movements cannot be produced in these holes at a depth, which for example, when using aqueous treatment liquids, corresponds approximately to the diameter of the hole.

In order to treat circuit boards with blind bores it is normal for example to treat the circuit boards in a device, in which the circuit boards are introduced in a horizontal position and horizontal direction through a treatment chamber; the circuit boards being situated within the treatment liquid during passage. In this way, it can at least be achieved, that gas bubbles which are situated in the holes on the top of the circuit boards can be removed relatively simply. A reliable exchange of material within the time available for treatment and particularly the removal of the gas bubbles from the holes on the underside of the circuit boards is however not possible with this method. Moreover even gas bubbles can no longer be removed with certainty, using this method, from holes in which the ratio of hole length to hole diameter exceeds a value of approximately 1.

Hence the problem underlying the invention is to avoid the disadvantages of the state of the art and particularly to find a reliable method and a device suited to the purpose of flushing holes provided in workpieces and other tiny hollow spaces, opening outwards, and also recesses with an opening width below 0.5 mm with a liquid treatment medium. In particular, a method and device for treating circuit boards provided with blind bores is to be produced.

The solution to the problem consists in directing a liquid jet of the treatment medium on to the surface of the substrate to be treated which has a diameter which is smaller than the opening width of the holes or recesses, i.e. in drilled holes of the diameter of the holes to be treated in the surface of the substrate. By substrate is meant any solid body or workpiece to be treated. By means of this it is possible to direct a flow of treatment medium into the inside of the holes and recesses such that an effective rinsing of the blind bore is also achieved even when these holes have a very small diameter, for example of 75 μm. The jet directed into the inside of the recess is reversed at its base, so that, within the hole, jets of treatment medium which are directed outwards are also formed.

According to the invention, this is effective primarily when the jet of treatment medium has a diameter, which at most amounts to half the diameter of the hole. If a jet has a diameter which is greater than the diameter of the hole, then the flow effect, according to the invention, can no longer be achieved in the hole.

Figure 2:
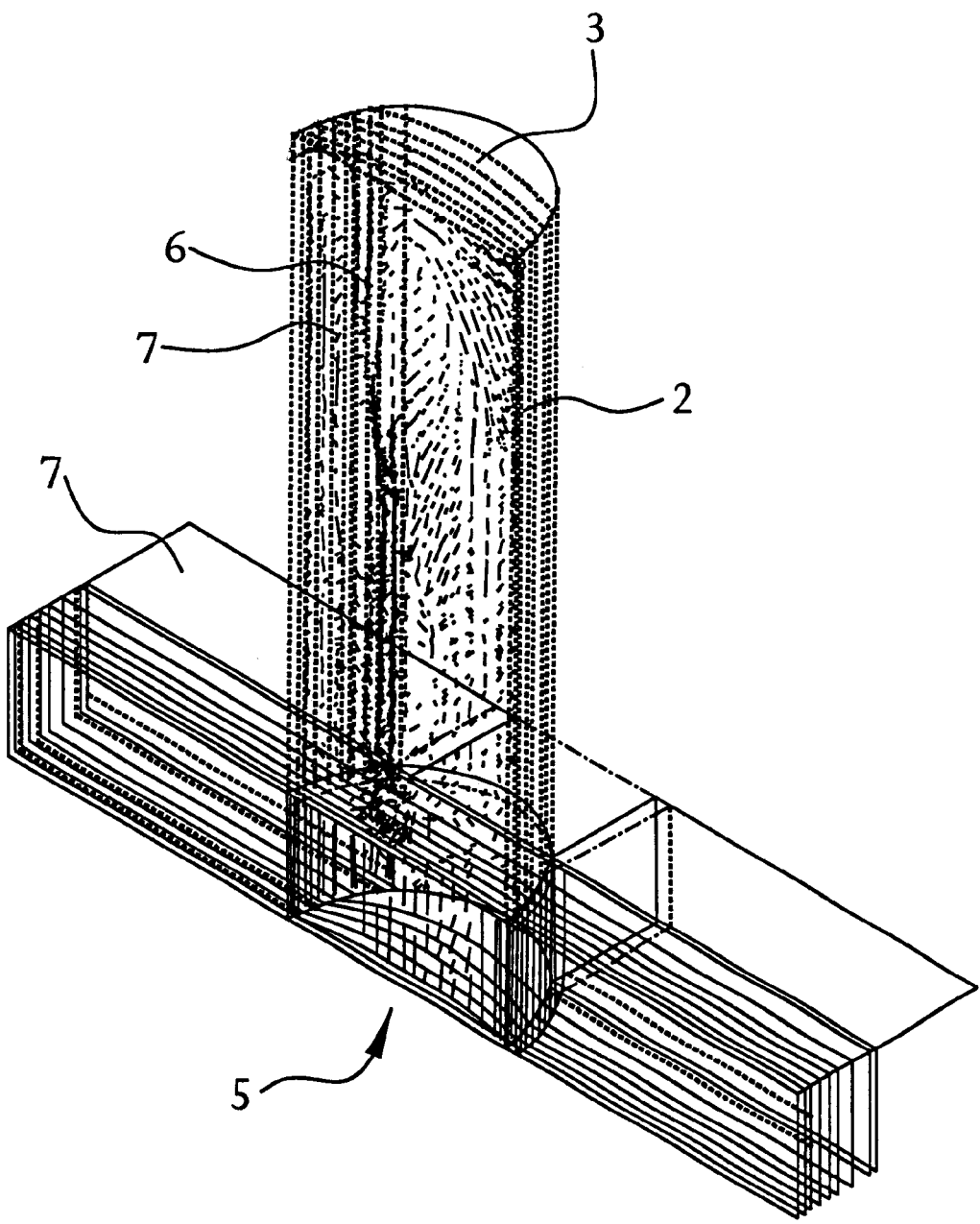
Figure 3:
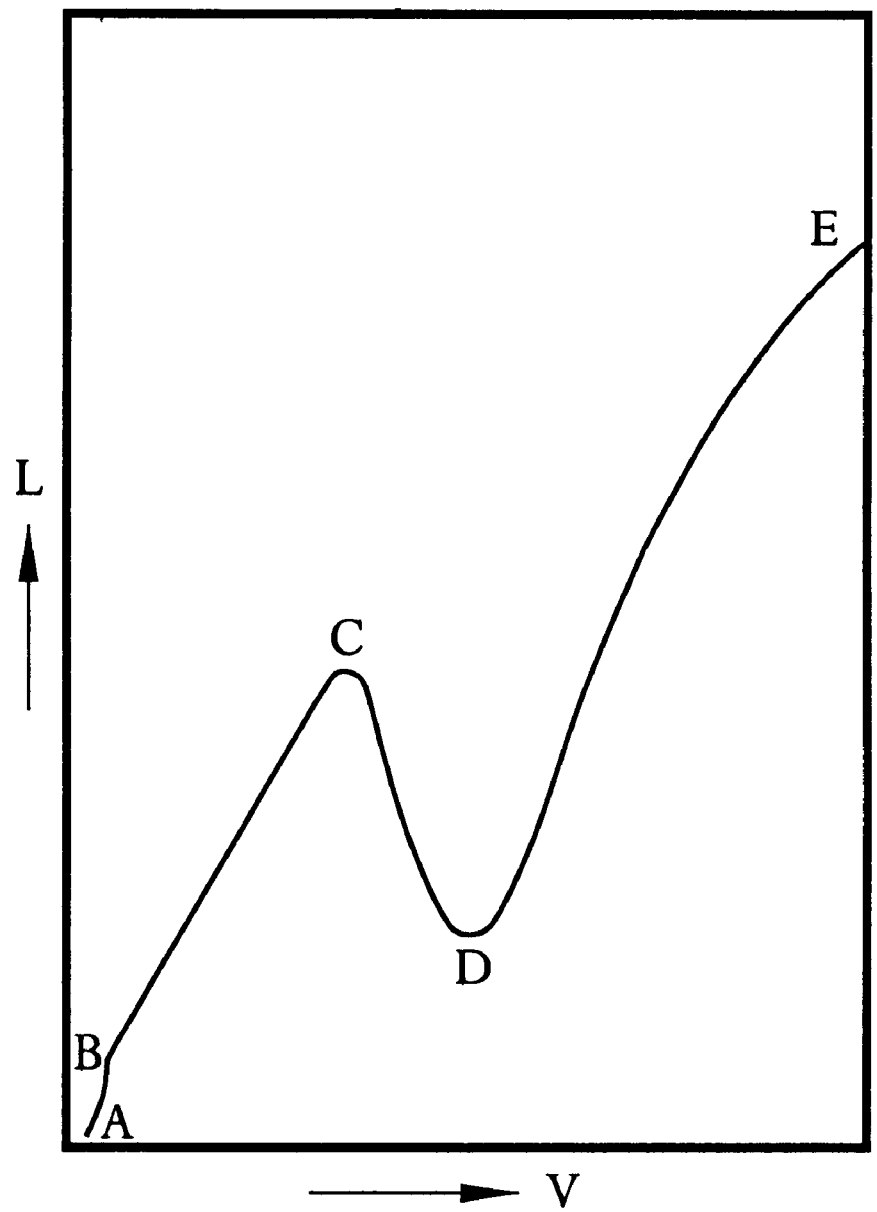
Figure 4:
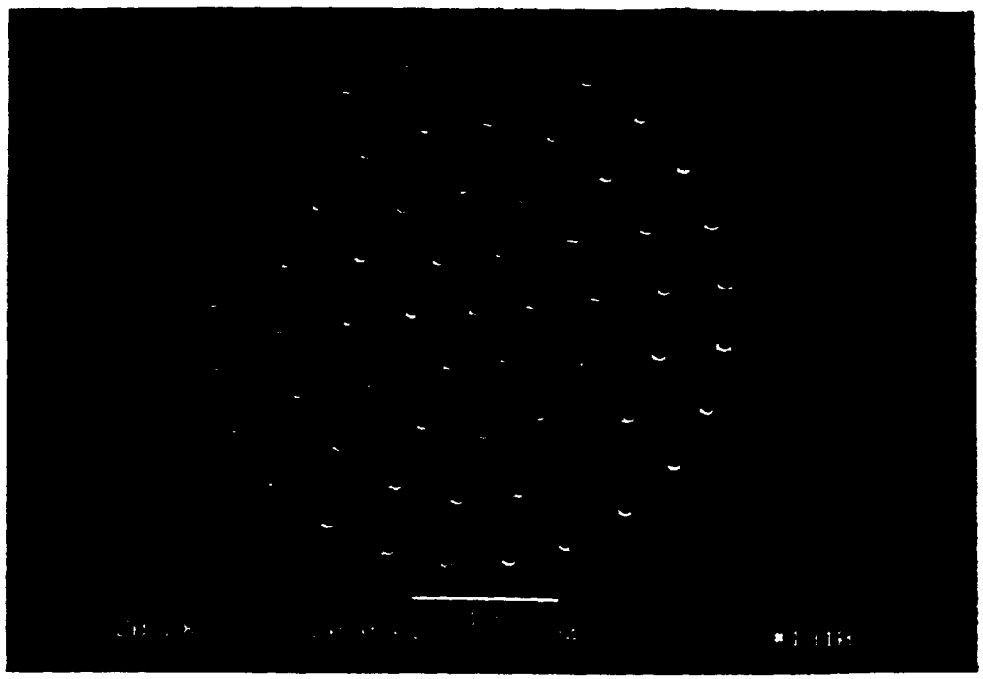
Figure 5:
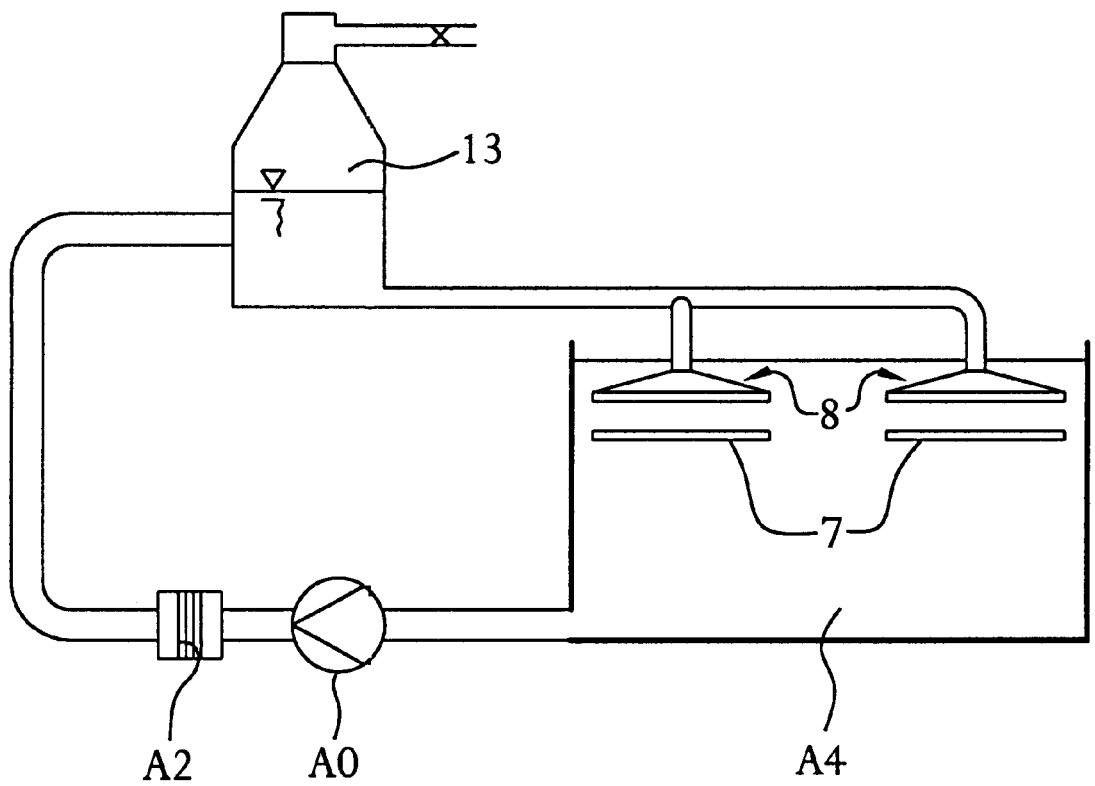
Figure 6:
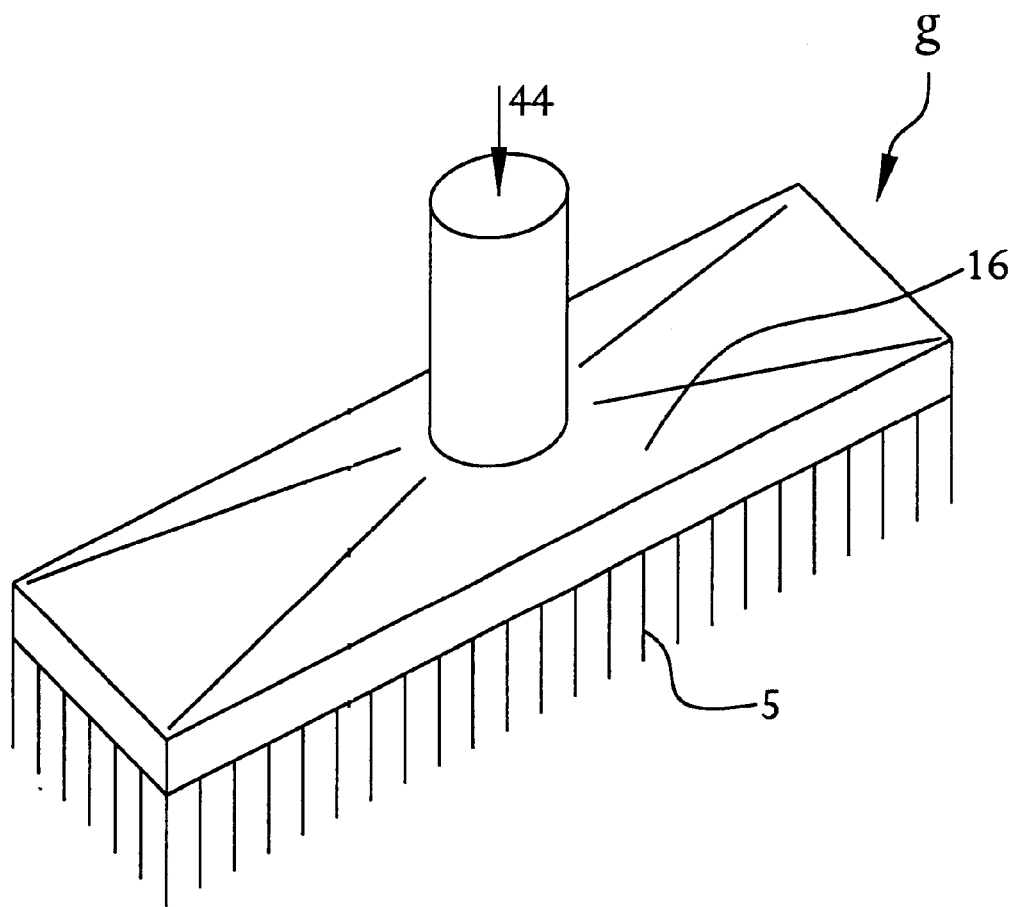
Figure 7:
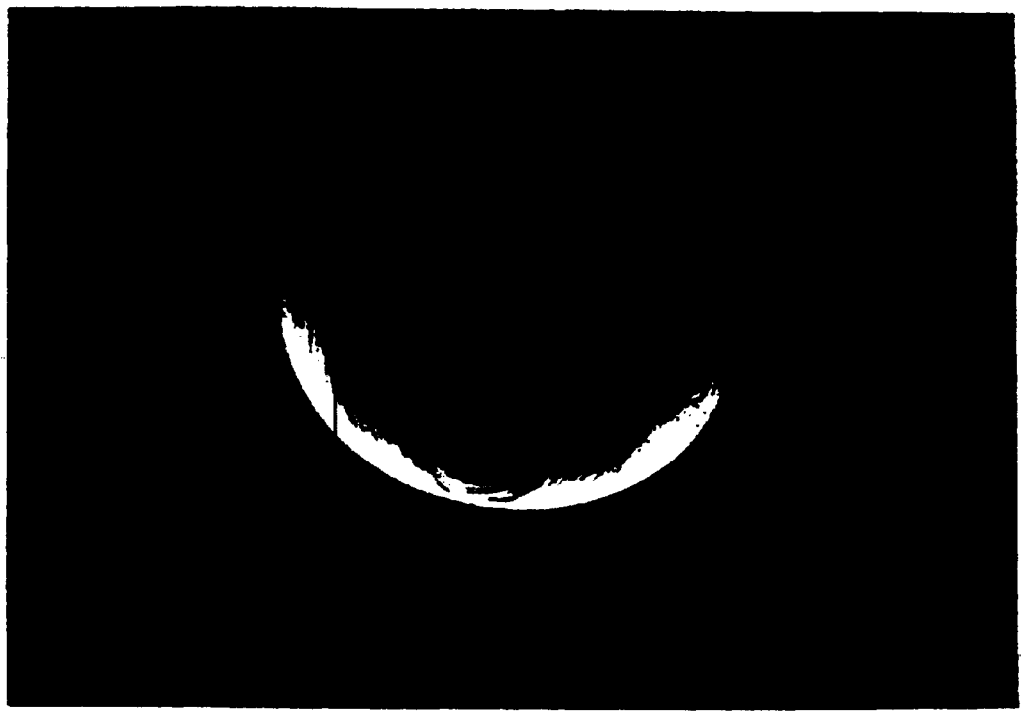
Figure 8:
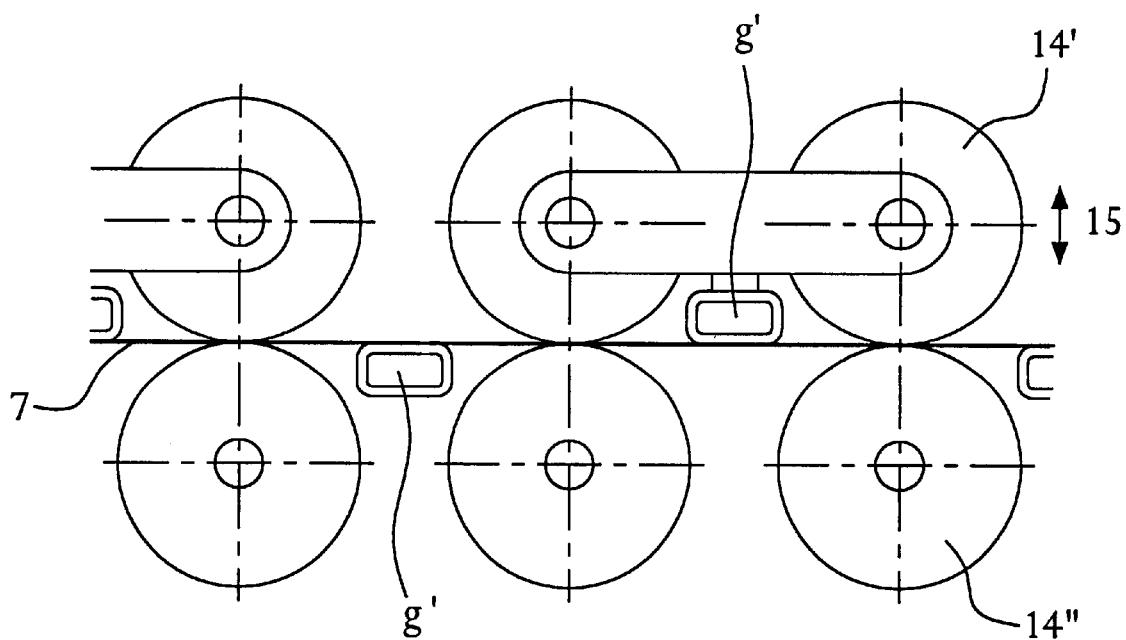

With the aid of the subsequently described drawings and figures, the method according to the invention is explained and the device is shown schematically or details of the device are depicted by means of photographic figures, which show;

FIG. 1: Cross-section of a blind bore in a circuit board, shown schematically;

FIG. 2: Flow conditions in a blind bore, computer simulation;

FIG. 3: Stability curve of a jet of treatment medium in air, shown schematically;

FIG. 4: View of the nozzle discharge openings in a multi-hole nozzle, photograph from a scanning electron microscope;

FIG. 5: Device according to the invention, shown schematically;

FIG. 6: Nozzle chamber with several nozzle openings, shown schematically;

FIG. 7: Nozzle opening, photograph from a scanning electron microscope;

FIG. 8: Treatment unit for the horizontal treatment of circuit boards, schematic side-view.

In FIG. 1 the self-adjusting flow conditions in a blind bore in a circuit board are shown schematically. If the jet of treatment medium 5 is directed centrally and along the hole axis into the preferably cylindrical hole 1 (hole length 1, hole diameter d) through the hole entrance 2 of a circuit board 7, the distribution of the flow within the hole, which is shown schematically, arises. The individual arrows 6 characterise local flow components. The jet 5 which is directed downwards is reversed upwards at the base of the hole 3. In this way a strong toroidal flow which is directed outwards arises along the wall 4 of the hole to be treated, so that gas bubbles, which adhere there through surface tension, are removed from the walls. Furthermore, the material transporter means, which is required for the treatment of the walls and the base of the hole, is also made possible in this way, through which material transporting means used materials are removed and materials required for the treatment are delivered. These flow components accumulate near the hole surface area and form an essentially toroidal flow profile 8 which is directed out of the hole.

If it concerns longitudinal holes in the recesses, the jet of treatment material is directed preferably essentially parallel to the longitudinal axis of the holes.

In a numerical simulation procedure according to the principle of finite volumes method (for example described in: E. Noll, Numerical flow technology ,Springer-Verlag Berlin, New York, 1993), flow conditions in a blind bore are represented graphically. In FIG. 2 a section through a blind bore 1 in a circuit board 7 is reproduced here and also the direction of the individual flow components in the hole, marked by arrows 6. The liquid jet 5, which is directed into the hole, is in this case not aligned quite centrally and is slightly deflected by the flow components 6 which are directed upwards and formed by reversal in the base of the hole 3. Nevertheless a flow profile is constructed which is adjacent to the walls 4 of the hole and directed outwards to the hole entrance, so that the operation according to the invention results.

The advantageous effect according to the invention is only achieved when the jet diameter is smaller than the opening width of the recesses to be treated. Particularly good results are achieved when the jet diameter is smaller than half the opening width of the recesses or of the diameter of the holes.

On the other hand the flow speed in the inside of the hole decreases again in the case of very small jet diameters, since the available impulse of the jet, which is directed into the hole, is then smaller. This effect is reproduced in Table 1. Liquid jets with varying diameters were directed into a hole with a diameter of 0.3 mm and a depth of 0.8 mm using various jet speeds. The effect, according to the invention, of the rinsing is represented by the speed of the liquid (speed at the base), which adjusts immediately above the base of the hole.

Maximum effect is achieved in the portrayed case when the diameter is about 0.1 mm (approximately 35% of the diameter of the hole). A very great reduction in the effectiveness of the flow within the hole can be observed when the jet diameter exceeds 0.16 mm (53% of the hole diameter) up to 0.2 mm (67% of the diameter of the hole). Even smaller changes in the diameter at larger values cause drastic effects. The same is also true for a change in the jet diameter from 0.05 mm (Δ17%) to 0.025 mm (Δ8.3%).

The effect according to the invention is negligible when the jets are discontinuous or rather fall as single droplets as they pass the entrance to the hole.

The fine jets of liquid can be produced by discharging the treatment medium from appropriate nozzles. For this purpose, sufficiently fine holes are inserted as nozzle discharge openings, or in general a jet production device configuring a nozzle, into a nozzle chamber, into which the liquid treatment medium flows. In order to produce the jets the liquid is pressurised. The stability of the liquid jets against the formation of droplets depends on various factors:

The invention avails itself then of known technology for the construction of laminar jets on the other side of the nozzle opening. (M. J. McCarthy, N. A. Molloy, Review of Stability of Liquid Jets and the Influence of Nozzle Design, The Chemical Engineering Journal, Volume 7 (1974) Pages 1–20). The jets tend fundamentally, in a gaseous environment, to break into droplets after a definite operating length (dispersal length L) i.e. at a definite distance from the nozzle discharge opening. This tendency is influenced primarily by the surface tension of the liquid emerging from the nozzle openings relative to the medium surrounding the free jets. Dependent upon the non-dimensional Weber number We of the liquid jets, various large dispersal lengths are observed. A characteristic relationship of the dispersal length L to the discharge speed v of the liquid from the nozzle opening is depicted in FIG. 3. According to that, there results a complicated dependency of the dispersal length L to the discharge speed. Only in the lower speed region is there a relation between the dispersal length roughly proportional to the speed v.

The dispersal length cannot therefore be selected irrespective of the Reynolds number Re of the liquid jet, when a certain type of liquid is used. For the use of free jets according to the invention, the dispersal length L must be as great as possible to ensure the formation of a continuous liquid jet between the nozzle and the workpiece surface to be treated or the holes and recesses contained within it. The non-dimensional parameter which is characteristic of the dispersal length L is the Weber number We, which is dependent upon the density ρ of the liquid treatment medium, the surface tension σ of the treatment medium, the discharge speed v and the discharge diameter d of the jet of the treatment medium in the following way:

$$We = v^2 \cdot d \cdot \rho \cdot \sigma^{-1},$$

TABLE 1

| Test No. | Jet Speed [m/s] | Jet diameter [mm] | Base Speed [m/s] |
|---|---|---|---|
| 1 | 3.0 | 0.1 | 0.45 |
| 2 | 1.5 | 0.2 | 0.01 |
| 3 | 1.5 | 0.16 | 0.1 |
| 4 | 1.5 | 0.14 | 0.12 |
| 5 | 1.5 | 0.1 | 0.22 |
| 6 | 1.5 | 0.05 | 0.1 |
| 7 | 1.5 | 0.025 | 0.01 |

For tubular nozzles, the non-dimensional dispersal length L/d is a function of the square-root of the Weber number $\sqrt{We}$.

A dispersal length of a few centimeters can be achieved for example, if a jet diameter of 150 μm is formed and if an aqueous liquid jet is produced under pressure from an appropriate nozzle opening into a gas, for example into air. The Weber number takes on the value We=206.9, so that $\sqrt{We}$=14.4, when an aqueous treatment medium with a discharge speed of v 10 m/s and a discharge diameter of d=150.10$^{-6}$ m is sprayed into the air (σ=72.5·10$^{-3}$ N/m,ρ=1 g/cm$^3$. In this case a non-dimensional dispersal length of L/d=86, i.e. the dispersal length L of 12.9 mm is attained. Within this distance the jet is homogenous and does not disperse into individual droplets. A substrate, which is to be treated and which is arranged at a spacing of less than this length from the nozzle discharge opening, is struck by a fine jet with a jet diameter of approximately 150 μm, in order that the effect according to the invention can be achieved.

If the aqueous treatment medium is not sprayed on the other hand into a gaseous atmosphere but into a liquid, other conditions arise since the Reynolds number of the jet represents the characterising parameter in this case. If the liquid is used as a liquid through which the jet of treatment medium is sprayed into the holes of the workpiece which is likewise situated in this liquid with which the workpiece is to be treated then the jet no longer disperses into individual droplets, since the surface tension δ is approaching zero. In this case on the other hand, the jet expands a little because of the higher viscosity of the medium surrounding the nozzle.

Hence a preferred embodiment is represented by a variation on the method, in which the workpiece to be treated is situated in the liquid treatment medium and in which the nozzle discharge openings, facing the workpiece surface closely, are likewise submerged in the treatment medium, since in this way very fine, stable jets can be produced.

In order to treat circuit boards, in which clearance holes and blind bores, which are distributed over the entire surface, are situated, it is further advantageous to move the circuit board and the nozzle continuously relative to one another. For example, the circuit board could be moved in a horizontal position and horizontal direction and preferably at a short distance past a stationary nozzle. On the other hand it is also possible to move the nozzle past the circuit board, for example if the circuit board is attached to a framework in a vertical fashion and submerged together with the latter into a treatment bath. In this way, the treatment liquid for improved flushing out from the nozzle discharge openings, which are located within the treatment medium, is directed on to the circuit board surface and into the holes. In both cases the jet of treatment medium washes over the surface of the circuit board and is thereby directed into the individual holes in the circuit board one after another.

In both application cases with linear direction of relative movement it is also advantageous to provide several nozzle discharge openings e.g. at the spacing of the holes beside one another in an appropriate device. In FIG. 4 a further example is shown for a circular arrangement of a multiplicity of very fine openings of approximately 60 μm diameter per nozzle head. In another embodiment several rows can also be provided with nozzle discharge openings, which are offset against one another, for example in an essentially flat nozzle head. In this way, several jets of treatment medium can be directed simultaneously and parallel to one another on to the circuit board surface and into the holes. The spacing of the individual holes must not however remain under a critical minimum spacing, since the liquid jets tend to merge with one another.

In order to direct the liquid jets accurately and uniformly also into clearance holes and blind bores in circuit boards, the nozzle discharge openings in the nozzle head can be arranged in several rows and offset against one another such that the offset between adjacent rows or a multiple of this offset corresponds roughly to the spacing of the clearance holes and/or blind bores.

With arrangements of this sort with several nozzle discharge openings in the device according to the invention it is possible to treat the individual holes in the circuit board by passing them over the nozzle with the free jets of liquid jets.

If the grid of nozzle openings which are arranged in a matrix does not accord with the grid of the holes arranged on the circuit board, individual holes will still not be struck by the free jets when the circuit board moves over the nozzles. In this situation, the nozzles can also be moved backwards and forwards, parallel to the circuit board surface and transversly to the relative movement of the circuit board to the nozzles. Instead of a backwards and forwards movement the nozzles can also be moved in a circular or elliptical path parallel to the surface of the circuit board.

In order to carry out this procedure, a device with one or several nozzles is inserted. The device, shown schematically in FIG. 5, comprises two nozzles 9 with respectively one or several nozzle discharge openings with a diameter under 0.5 mm, in addition a liquid supply unit, typically a pump 10, by means of which liquid treatment medium is pumped through the nozzle discharge openings, and a filter unit 12, communicating with the openings and the supply unit, for removing particles from the treatment medium. Immediately beside the nozzle discharge openings, the workpieces to be treated, in this case circuit boards 7, are either located in a stationary manner or the workpieces are passed over nozzles, by means of appropriate transport medium which is directly next to the nozzle discharge openings.

In order to prevent the very small discharge openings being blocked by particles in the treatment liquid, the liquid must also be very carefully freed of very fine particles or impurities before discharging from the nozzle. For this purpose, the filter unit 12 is provided. Furthermore, the liquid is freed of entrained gas by means of a bubble trap 13 before entering into the nozzles, in order to prevent the jets being disturbed by gas escaping out of the openings.

In order to produce sufficiently stable and fine free jets, nozzles are provided with very fine nozzle discharge openings, for example with a diameter of 0.02 mm to 0.5 mm. The diameters and the grid spacing of the individual nozzle holes can be fitted to the diameter and the grid spacing of the holes in the circuit boards. For this purpose, appropriate hollow pieces, for example, with openings preferably on a flat side (nozzle head) are used (FIG. 6). The nozzle openings are produced for example by laser drilling. The holes can be produced also by means of a chemical etching process by applying a stable photosensitive resist against the etching means on to the surface, in which the holes are to be etched, said resist being exposed with the hole pattern and the holes being formed after developing with suitable etching means.

The liquid jet 5 is produced by the nozzle discharge openings, which are situated on the underside of the nozzle. For this purpose, the liquid 11 is fed into the nozzle under pressure from above.

The shape of the discharge openings is likewise critical for the quality of the free jets which are formed. Particularly openings (FIG. 7) which taper in the direction of the jet 5 of treatment medium ensure that the speed distribution of the liquid in the jets has no radial non-homogeneities so that the jets tend to expand or disperse into individual droplets only to a small extent.

If nozzles with matrix-like nozzle discharge openings, which are arranged in several rows are used, it must, furthermore, be seen to, that all liquid jets emerge from the openings with roughly the same pressure. If this is not the case constant results cannot be achieved. For this purpose, there is a distribution chamber 16 in the nozzle, through which the treatment medium flows before penetrating through the discharge openings, with the result that the quantities of treatment medium passing through the individual holes are evened out. The constructional design of distribution chambers of this type is possible according to the principal points, which are described extensively in; F. Durst, U. Lange and H. Raszillier, Optimisation of Distribution Chambers of Coating Facilities, Chemical Engineering Science, Volume 49(1994),Part 2, Pages 161–170.

Circuit boards can be conducted in a horizontal position and in a horizontal direction through a treatment unit, in which the treatment liquid is directed from above and/or from below on to the circuit board surfaces. The circuit boards are, in this case, directed past the nozzles at a small spacing. Within the treatment chamber there are situated the circuit boards as well as the nozzle openings, preferably within the treatment solution. In order to move the circuit boards through this arrangement, transporting devices (rollers or wheels) 14', 14" are provided, between which the circuit boards 7 are directed (FIG. 8). The transporting devices extend just like the nozzles, preferably over the entire width of the circuit boards. Between the transporting devices, the nozzles 9',9", according to the invention are arranged. The upper transporting devices 14' are connected with the nozzles 9' in a fixed unit. While the lower transporting devices 14" and lower nozzles 9" adopt a secure vertical position, the upper transporting devices and nozzles are movable in a vertical direction 15, so that differences in thickness in the circuit boards may be evened out. Since the upper transporting devices and nozzles are connected with one another, a fixed spacing can be arranged between the nozzle openings and the circuit board surface.

Instead of circuit boards, other solid bodies or workpieces with fine openings and recesses can also be treated effectively using the method according to the invention. For example fine sieves, spinning nozzles or similar workpieces can be cleaned advantageously.

The following example serves to explain the invention in greater detail. Blind bores with a diameter of 0.3 mm in circuit board blanks without copper lamination made from FR4-material(epoxy resin plates strengthened with glass-fibre mats, FR: flame retardant) and having varying blind bore depths were to be treated with an aqueous permanganate solution.

The boards contained the holes in individual testing sections with the same blind bore depths of 0.3 mm, 0.5 mm, 1.0 mm or 2.0 mm within the sections. The holes were arranged within the 25 mm×25 mm testing section matrix at a spacing of 0.6 mm (mean spacing of the holes) respectively.

The circuit board blanks were conveyed continuously in a horizontal direction through a treatment unit, in which the boards were aligned in a horizontal position. The treatment solution was applied from below on to the circuit board blanks. For this purpose a fine jet-nozzle brush was used, in the first place, with openings of 0.1 mm diameter and with a 30 mm wide nozzle opening region (entire opening cross-section circa 120 $mm^2$), said openings being arranged at a distance of 0.5 mm from one another. Furthermore, there was also in the treatment unit a traditional splash nozzle stick beneath the plane of movement for the circuit board blanks, by means of which a strong splash jet of treatment solution was directed on to the circuit board surface. The spacing of the splash nozzle from the circuit board surface was 5 mm, the spacing of the fine jet-nozzle brush from the board 15 mm.

The blanks were moved, in several experiments, through the unit with feed-in speeds of 0.2 m/min and 0.5 m/min.

In order to evaluate the success of the treatment of the individual holes in the transparent circuit board material, the wall surface portion within the holes, which was stained with the permanganate treatment, was assessed by means of a stereo-microscope in the cross-sectional view of the board. In the following tables the results of the experiments are reproduced. The given values represent the portion of the stained surface within the holes. A smaller portion of stained surface indicates an insufficient transportation of liquid into the holes.

TABLE 1

(fine jet nozzle)

| Passage Speed [m/min] | Bore Depth 0.3 mm | Bore Depth 0.5 mm | Bore Depth 1.0 mm |
| --- | --- | --- | --- |
| 0.2 | 100% | 100% | 100% |
| 0.5 | 100% | 100% | 100% |

TABLE 2

(splash nozzle)

| Passage Speed [m/min] | Bore Depth 0.3 mm | Bore Depth 0.5 mm | Bore Depth 1.0 mm |
| --- | --- | --- | --- |
| 0.2 | 100% | 100% | 35% |
| 0.5 | 100% | 100% | 10% |

What is claimed is:

1. Method for treating holes or recesses extending into workpieces with an opening width below 0.5 mm using a liquid treatment medium emerging from a nozzle, characterised in that a jet of the treatment medium with a diameter, which is smaller than the opening width, is directed into the holes or recesses.

2. The method according to claim 1, characterised in that the jet of the liquid treatment medium is directed through a liquid on to the workpieces situated in said liquid or through a gas space on to the workpieces situated in this gas space.

3. The method according to one of claims 1–2, characterised in that the workpiece and the jet are moved relative to one another so that the jet of the treatment medium washes over the surface of the workpiece and is directed into the holes or recesses one after another.

4. The method according to one of claims 1–2, characterised in that several jets of the treatment medium are directed simultaneously and parallel to one another on to the surface of the workpiece and into the holes and/or recesses.

5. The method according to one of claims 1–2, characterised in that the nozzle is moved backwards and forwards transversely to the relative movement and parallel to the surface of the workpiece or in a circular or elliptical path parallel to the surface of the workpiece.

6. The method according to one of claims 1–2, characterised in that circuit boards are directed past the nozzle in a horizontal position and horizontal direction at a short spacing.

7. The method according to one of claims 1–2 wherein the workpieces are circuit boards provided with clearance holes and/or blind bores.

8. Device for treating holes or recesses extending into workpieces with an opening width below 0.5 mm using a liquid treatment medium emerging from a nozzle, wherein a jet of treatment medium is provided having a diameter that is smaller than the opening width, characterised by a nozzle (9) with one or several nozzle discharge openings with a diameter below 0.5 mm, with a liquid distribution unit (10), by means of which liquid treatment medium is pumped through the nozzle discharge openings and with a filter unit (12), communicating with the openings and the distribution unit, for removing particles from the treatment medium (11).

9. The device according to claim 8, characterised in that, the nozzle discharge openings taper in the direction of the treatment jet (5).

10. The device according to one of the claims 8 or 9, characterised by several nozzle discharge openings in a matrix arrangement in an essentially flat nozzle head.

11. The device according to claim 10, characterised in that, the nozzle discharge openings are arranged in the nozzle head in several rows which are offset against one another.

12. The device according to any one of claim 8 or 9 characterised by a distribution chamber (16) for the treatment medium, said distribution chamber evening out the amount of treatment medium (11) flowing through the individual nozzle holes and being located in front of the nozzle discharge openings.

13. The device according to claim 12, characterised by means for moving circuit boards (7) horizontally which are arranged in a horizontal position relative to the nozzle (9).

14. The device according to claim 13, characterised in that, several nozzles (9',9") are arranged between transportation devices (14',14") by means of which the circuit boards (7) are moved and in that, the nozzles (9',9") extend at least over the entire width of the circuit boards (7).

15. The device for treating clearance holes and blind bores in circuit boards according to any one of claim 8 or 9, characterised in that the nozzle discharge openings in an essentially flat nozzle head are arranged in several rows which are offset against one another, and in that the offset between adjacent rows or a multiplicity of said offset roughly corresponds to the spacing of the clearance holes and/or blind bores from one another.

16. The method according to claim 1, wherein the diameter of the jet is smaller than half the opening width.

* * * * *

UNITED STATES PATENT AND TRADEMARK OFFICE
CERTIFICATE OF CORRECTION

PATENT NO. : 6,240,934 B1
DATED : June 5, 2001
INVENTOR(S) : Franz Durst, Gunter Brenn, Michael Schafer, Heinrich Meyer, Heribert Streup It is certified that error appears in the above-identified patent and that said Letters Patent is hereby corrected as shown below:

<u>Column 5,</u>
Line 35, after "v" insert an "equal" sign as follows -- = --.

Signed and Sealed this

Nineteenth Day of February, 2002

Attest:

JAMES E. ROGAN
Attesting Officer   Director of the United States Patent and Trademark Office